United States Patent
Lee

(10) Patent No.: US 10,263,212 B2
(45) Date of Patent: Apr. 16, 2019

(54) OLED DEVICE WITH AUXILIARY ELECTRODE CONNECTED TO CATHODE

(71) Applicant: LG Display Co., Ltd., Seoul (KR)

(72) Inventor: Junho Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 29 days.

(21) Appl. No.: 15/238,957

(22) Filed: Aug. 17, 2016

(65) Prior Publication Data
US 2017/0155078 A1    Jun. 1, 2017

(30) Foreign Application Priority Data

Nov. 30, 2015 (KR) .................. 10-2015-0168885

(51) Int. Cl.
*H01L 51/52* (2006.01)
*H01L 27/32* (2006.01)
*H01L 51/00* (2006.01)

(52) U.S. Cl.
CPC ...... *H01L 51/5228* (2013.01); *H01L 27/3258* (2013.01); *H01L 51/0021* (2013.01); *H01L 27/3276* (2013.01)

(58) Field of Classification Search
CPC ............. H01L 51/5228; H01L 27/3258; H01L 51/0021; H01L 27/3276
See application file for complete search history.

(56) References Cited

U.S. PATENT DOCUMENTS

| | | | | |
|---|---|---|---|---|
| 2006/0125390 A1* | 6/2006 | Oh | ...................... | H01L 27/3276 313/506 |
| 2010/0244664 A1* | 9/2010 | Fujioka | ............... | H01L 51/5212 313/504 |
| 2014/0117363 A1* | 5/2014 | Koresawa | ........... | H01L 27/3274 257/59 |
| 2014/0346459 A1* | 11/2014 | Song | .................... | H01L 51/5228 257/40 |
| 2015/0144922 A1* | 5/2015 | Moon | ................. | H01L 27/3279 257/40 |
| 2016/0141341 A1* | 5/2016 | Kajiyama | ........... | H01L 27/3279 257/72 |
| 2016/0149155 A1* | 5/2016 | Kim | .................... | H01L 51/5228 257/40 |

OTHER PUBLICATIONS stackechange, "How large is "one pixel" for S5 AMOLED display?" https://electronics.stackexchange.com/questions/124082/how-large-is-one-pixel-for-s5-amoled-display (2014).*

* cited by examiner

*Primary Examiner* — Peter Bradford
(74) *Attorney, Agent, or Firm* — Morgan, Lewis & Bockius LLP

(57) ABSTRACT

Provided is an organic light emitting display device in which a plurality of pixel areas each including an emitting area and a non-emitting area is defined in a display area. The organic light emitting display device includes: an auxiliary electrode in a part of a non-emitting area of at least one pixel area; an auxiliary electrode contact portion formed as a part of the auxiliary electrode; a first electrode in the emitting areas of the plurality of pixel areas; an organic layer on the first electrode and the auxiliary electrode; and a second electrode on the organic layer. The auxiliary electrode contact portion electrically connects the auxiliary electrode and the second electrode. A distance from a center of the auxiliary electrode contact portion to a terminal end of the first electrode in the emitting area may be 3 μm or more.

9 Claims, 17 Drawing Sheets

OLED DEVICE WITH AUXILIARY ELECTRODE CONNECTED TO CATHODE

CROSS-REFERENCE TO RELATED APPLICATIONS

This application claims the priority of Korean Patent Application No. 10-2015-0168885 filed on Nov. 30, 2015, in the Korean Intellectual Property Office, the disclosure of which is incorporated herein by reference.

BACKGROUND

Field

The present disclosure relates to an organic light emitting display device and more particularly, to an organic light emitting display device which can be reduced in power consumption and improved in luminance uniformity by minimizing damages to a pixel area caused by laser processing during manufacturing of an auxiliary electrode and a second electrode and improving contact characteristics of the auxiliary electrode.

Description of the Related Art

An organic light emitting display (OLED) device is a self-light emitting display device. The OLED device uses an organic light emitting element in which electrons and holes are injected into an emission layer from an electrode (cathode) for injecting electrons and an electrode (anode) for injecting holes, respectively, and the electrons and holes are combined into excitons. When the excitons transition from an excited state to a ground state, lights are emitted from the organic light emitting element.

The OLED device can be classified into a top emission type, a bottom emission type, and a dual emission type depending on a direction of light emission, and can also be classified into a passive matrix type and an active matrix type depending on a driving method.

The OLED device does not need a separate light source as needed in a liquid crystal display (LCD) device. Thus, the OLED device can be manufactured into a lightweight and thin form. Further, the OLED device is advantageous in terms of power consumption since it is driven with a low voltage. Also, the OLED device has excellent color expression ability, a high response speed, a wide viewing angle, and a high contrast ratio (CR). Therefore, the OLED device has been researched as a next-generation display device.

As high-resolution display devices develop, the number of pixels per unit area has been increased and a higher luminance has been demanded. However, in a light emitting structure of the OLED device, there is a limitation in luminance (Cd) per unit area (A), and an increase in applied current causes a decrease in the reliability of the OLED device and an increase in power consumption.

Accordingly, it is necessary to overcome the limitations in emission efficiency, lifetime, and power consumption of an organic light emitting element that hinder a quality and productivity of the OLED device. Thus, various studies for developing an organic light emitting element capable of improving emission efficiency, a lifetime of an emission layer, and a viewing angle while maintaining a color area are being conducted.

An organic light emitting display device includes an organic emission layer formed between a first electrode (anode) and a second electrode (cathode) facing each other. The first electrode is formed corresponding to each sub-pixel area, and the second electrode is formed commonly corresponding to a plurality of sub-pixel areas.

Unlike the first electrode formed corresponding to each sub-pixel area, the second electrode is formed corresponding to all of a plurality of sub-pixel areas and thus has a higher resistance than the first electrode.

Particularly, if the organic light emitting display device is of top emission type in which a light is emitted along a path penetrating the second electrode, the second electrode is formed of a transparent conductive material as thin as possible to increase the luminance of a pixel area. Thus, the second electrode may have a higher resistance.

That is, due to a high resistance of the second electrode, the luminance uniformity in the pixel area is decreased. Further, power consumption of the organic light emitting display device is increased in order to secure a desired level of luminance.

In order to solve this problem, the organic light emitting display device further includes a separate auxiliary electrode formed of a material having a lower resistance than the second electrode in order to reduce a resistance of the second electrode.

In order to electrically connect the auxiliary electrode and the second electrode, a laser (or other energy source) is irradiated to an auxiliary electrode contact area. Thus, a metal electrode material is melted by heat energy of the momentary laser to form a contact between the auxiliary electrode and the second electrode.

However, due to the laser irradiated to the auxiliary electrode contact area, other areas in a lower substrate, i.e., an emitting area in the pixel area, may be damaged. The present inventors specifically recognized this problem of damage caused by laser processing and have sought to overcome this problem.

SUMMARY

Accordingly, the present invention is directed to an organic light emitting display device that substantially obviates one or more of the problems due to limitations and disadvantages of the related art An object of the present disclosure is to provide an organic light emitting display device which can be reduced in power consumption and improved in luminance uniformity by minimizing damages to a pixel area (and/or other areas and elements) caused by a laser during a laser contact with an auxiliary electrode and improving electrical contact characteristics of the auxiliary electrode.

Another object of the present disclosure is to provide an organic light emitting display device which can be reduced in power consumption and improved in luminance uniformity by minimizing damages to a pixel area caused by a laser during a laser contact with an auxiliary electrode and improving contact characteristics of the auxiliary electrode.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting display device has a plurality of pixel areas each of which includes an emitting area and a non-emitting area defined in a display area. The organic light emitting display device comprises an auxiliary electrode in a part of the non-emitting areas of the plurality of pixel areas; an auxiliary electrode contact portion formed as a part of the auxiliary electrode; a first electrode in the emitting areas of the plurality of pixel areas; an organic layer on the first electrode and the auxiliary electrode; and a second electrode on the organic layer. The auxiliary electrode contact portion electrically connects the auxiliary electrode and the second electrode. A distance from a center of the auxiliary electrode contact portion to a terminal end of the first electrode in the emitting area is 3 μm or more.

In another aspect, an apparatus comprises a substrate having a plurality of pixels, each pixel including a light emitting area and a non-emitting area, an auxiliary electrode in the non-emitting areas, said auxiliary electrode having a contact portion; and an organic light emitting structure, in the light emitting areas, having an organic layer sandwiched between a cathode and an anode, and at least a portion of said organic layer on said auxiliary electrode, said contact portion of said auxiliary electrode is configured to electrically connect said auxiliary electrode with said cathode, and is configured to be at a specific distance away from said light emitting area, said specific distance being sufficient to minimize damage caused by heat or energy used in connecting said auxiliary electrode with said cathode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
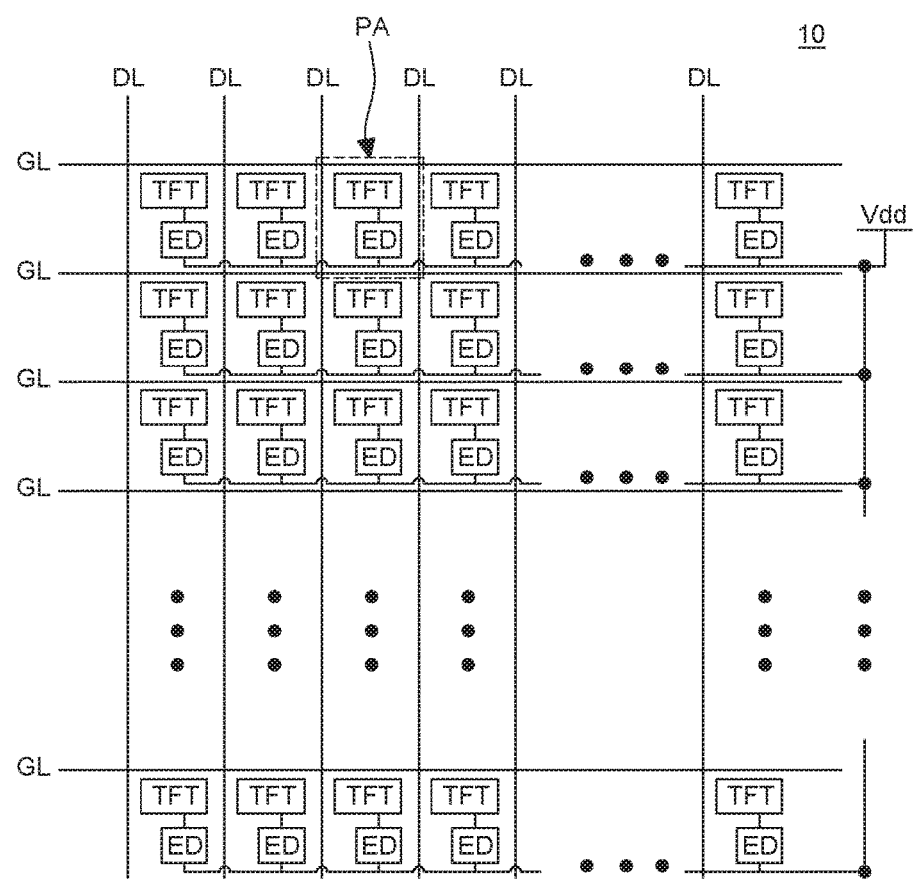
FIG. 1 is a schematic plane view of an organic light emitting display device according to exemplary embodiments of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention, and the present disclosure will be defined by the appended claims.

The shapes, sizes, ratios, angles, numbers, and the like shown in the accompanying drawings for describing the exemplary embodiments of the present disclosure are merely examples, and the present disclosure is not limited thereto. Like reference numerals generally denote like elements throughout the present specification. Further, in the following description, a detailed explanation of well-known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated. When the position relation between two parts is described using the terms such as "on", "above", "below", "next" and the like, one or more parts may be positioned between the two parts unless the terms are used with the term "immediately" or "directly".

Although the terms "first", "second", and the like are used for describing various components, these components are not confined by these terms. These terms are merely used for distinguishing one component from the other components.

Therefore, a first component to be mentioned below may be a second component in a technical concept of the present disclosure.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, an organic light emitting display device according to exemplary embodiments of the present disclosure will be described in detail with reference to the accompanying drawings.

FIG. 1 is a diagram illustrating a schematic plane structure of an organic light emitting display device according to exemplary embodiments of the present disclosure.

Referring to FIG. 1, an organic light emitting display device 10 according to an exemplary embodiment of the present disclosure includes gate lines GL and data lines DL intersecting with each other and a plurality of pixel areas PA are defined. Further, the organic light emitting display device 10 includes a plurality of thin film transistors TFT respectively corresponding to the plurality of pixel areas PA and a plurality of organic light emitting elements ED respectively formed in emitting areas of the plurality of pixel areas PA.

The plurality of organic light emitting elements ED is connected to at least one thin film transistor TFT and connected to a reference power supply Vdd. Thus, each of the organic light emitting elements ED emits a light to the outside on the basis of a driving current corresponding to a potential difference between each thin film transistor TFT and the reference power supply Vdd.

According to the respective exemplary embodiments to be described with reference to the accompanying drawings, each of the plurality of pixel areas PA includes an emitting area EA configured to emit light used to display an image and includes a non-emitting area NEA.

Figure 2:
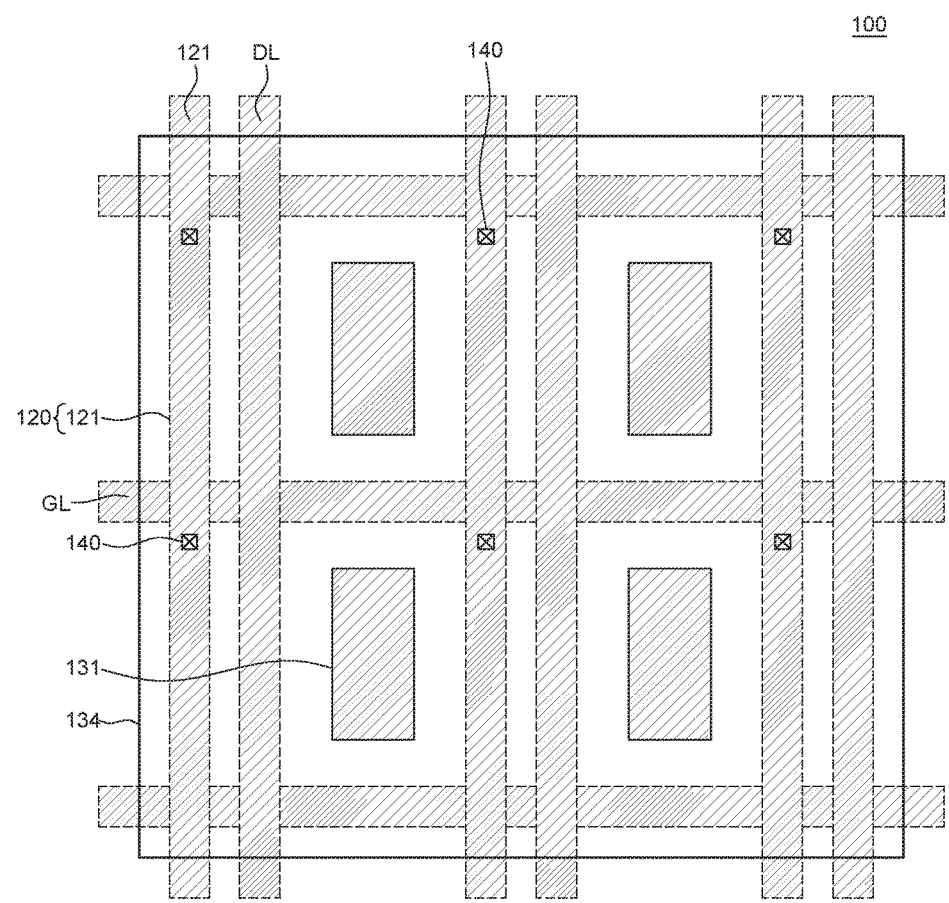
FIG. 2 is a plane view of an organic light emitting display device according to an exemplary embodiment of the present disclosure.
Figure 3:
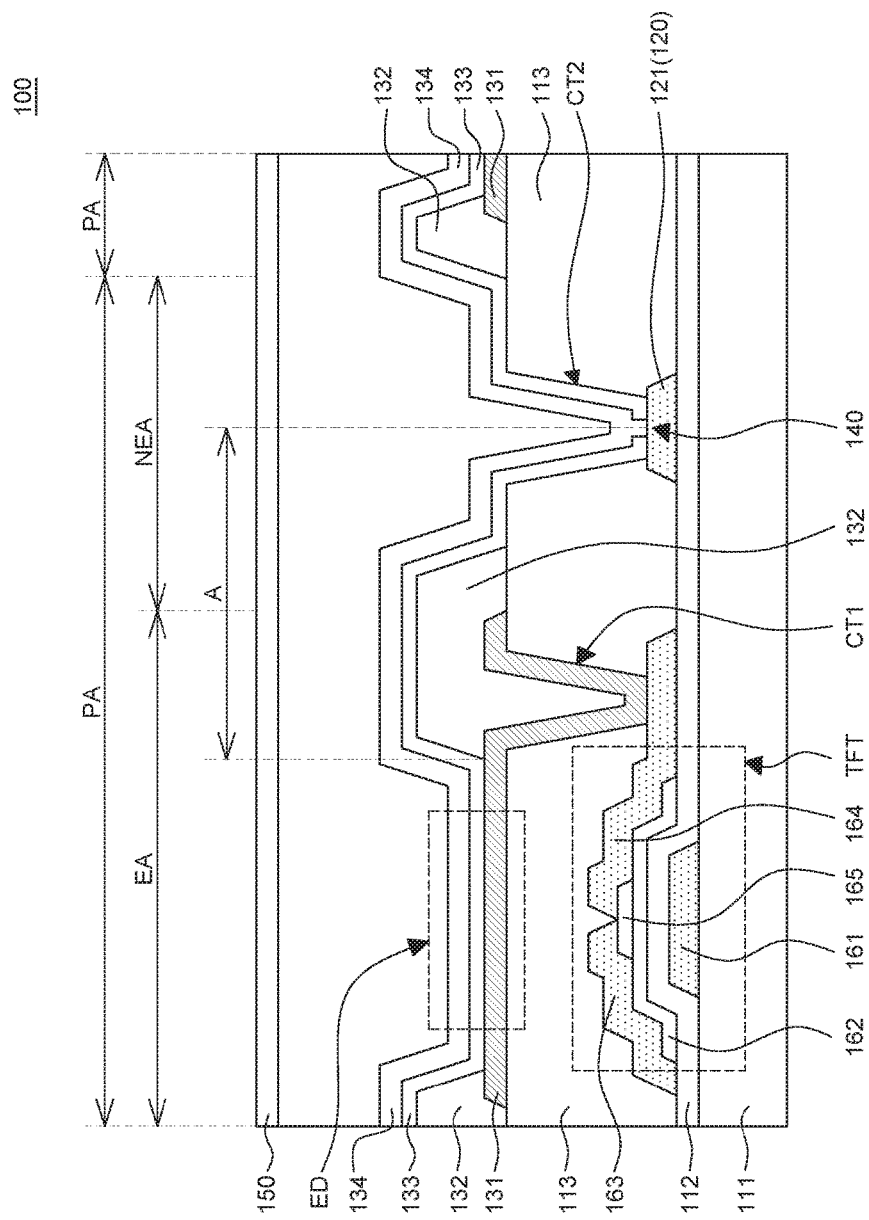
FIG. 3 is a diagram illustrating a cross-sectional structure of the organic light emitting display device according to an exemplary embodiment of the present disclosure illustrated in FIG. 2.

Further, referring to FIG. 1, FIG. 2, and FIG. 3, an organic light emitting display device according to each exemplary embodiment may include: a thin film transistor TFT formed in each pixel area PA on a substrate 111; gate lines (GL in FIG. 1) formed on the substrate 111; a gate insulation film 112 formed on the entire surface of the substrate 111 and covering the gate lines GL; data lines (DL in FIG. 1) formed on the gate insulation film 112 and intersecting with the gate lines GL so as to define a plurality of pixel areas PA; an auxiliary electrode 120 formed on a part of the non-emitting area NEA; and an overcoating layer 113 formed on the entire surface of the gate insulation film 112 and covering the thin film transistor TFT, the gate lines GL, the data lines DL, and the auxiliary electrode 120.

The organic light emitting display device according to each exemplary embodiment may further include: a first electrode 131 formed in the emitting area EA on the overcoating layer 113 and connected to the thin film transistor TFT; a bank layer 132 formed at an outer periphery of the emitting area EA on the overcoating layer 113 and overlapped at least in part on an edge of the first electrode 131; an organic layer 133 formed on the entire surface of the overcoating layer 113 and covering the first electrode 131 and the bank layer 132; a second electrode 134 formed on the entire surface of the organic layer 133; an auxiliary electrode contact portion 140 formed by allowing a part of the auxiliary electrode 120 to penetrate the organic layer 133 and spread (or expand) to the second electrode 134 and configured to connect the auxiliary electrode 120 and the second electrode 134; and a sealing layer 150 facing the second electrode 134.

FIG. 2 is a plane view of an organic light emitting display device according to an exemplary embodiment of the present disclosure.

Further, FIG. 3 is a diagram illustrating a cross-sectional structure of the organic light emitting display device according to an exemplary embodiment of the present disclosure illustrated in FIG. 2.

Referring to FIG. 2 and FIG. 3, in an organic light emitting display device 100 according to an exemplary embodiment of the present disclosure, a thin film transistor TFT corresponding to each pixel area PA includes a gate electrode 161, a semiconductor layer 162, a source electrode 163, and a drain electrode 164.

Like the gate lines GL, the gate electrode 161 is formed on the substrate 111. Further, the gate electrode 161 is branched from the gate lines GL and connected to the gate lines GL.

The semiconductor layer 162 is formed on the gate insulation film 112 so as to be overlapped with at least a part of the gate electrode 161. Herein, the semiconductor layer 162 may be formed of any one of oxide semiconductor, poly silicon (poly-crystalline silicon), and amorphous silicon (a-Si: non-crystalline silicon), as well as any other type of appropriate semiconductor material.

Like the data lines DL, the source electrode 163 and the drain electrode 164 are formed on the gate insulation film 112 so as to be spaced away from each other. Further, the source electrode 163 and the drain electrode 164 are disposed to be at least partially overlapped on or otherwise electrically connected to both sides of the semiconductor layer 162.

Herein, any one of the source electrode 163 and the drain electrode 164 is branched from the data lines DL and connected to the data lines DL. Further, the other one which is not connected to the data lines DL is exposed at least in part through a main contact hole CT1 penetrating the overcoating layer 113 and connected to the first electrode 131.

Further, if the semiconductor layer 162 is formed of oxide semiconductor, the thin film transistor TFT may further include an etch-stopper layer 165 formed on the semiconductor layer 162. Herein, the source electrode 163 and the drain electrode 164 are overlapped on both sides of the etch-stopper layer 165.

The first electrode 131 corresponds to at least an emitting area EA of each pixel area PA, and is formed on the overcoating layer 113. Further, the first electrode 131 is connected to one of the source electrode 163 and the drain electrode 164 of the thin film transistor TFT, which is not connected to the data lines DL, through the main contact hole CT1 penetrating the overcoating layer 113.

The first electrode 131 functions as an anode. Therefore, the first electrode 131 may be formed of a transparent conductive material having a relatively high work function. For example, the transparent conductive material may include indium tin oxide (ITO) or indium zinc oxide (IZO) or various other types of alloys.

Further, in order to improve reflection efficiency, the first electrode 131 may further include a reflection film or some other functional layer formed of a metal material having a high reflection efficiency under the first electrode 131. For example, the metal material may include silver (Ag), aluminum (Al), various other metals, and compounds thereof.

The bank layer 132 includes portions at an outer periphery of the emitting area EA in each pixel area PA and is formed on the overcoating layer 112. The bank layer 132 defines the emitting area EA of the organic light emitting display device and suppresses light leakage from the non-emitting area NEA.

Further, the bank layer 132 may be overlapped at least in part with the edge of the first electrode 131. A stepped portion (or other type of non-smooth irregularity) of the first electrode 131 is covered by the bank layer 132, and, thus, it is possible to suppress faster degradation of the organic layer 133 caused by a current flow concentrated in the stepped portion of the first electrode 131.

The organic layer 133 is formed on the entire (or substantial) surface of the overcoating layer 113 so as to correspond to the entire (or substantial) surface of a display area, i.e., all (or substantially all) of the plurality of pixel areas PA. Thus, the organic layer 133 is formed to cover the first electrode 131 and the bank layer 132.

The organic layer 133 is formed between the first electrode 131 and the second electrode 134. The organic layer 133 emits a light by combination of holes supplied from the first electrode 131 and electrons supplied from the second electrode 134.

The organic layer 133 may be formed using an open mask corresponding to the display area. The organic layer 133 may be formed into a multilayer structure of organic materials respectively having different components or compositions. For example, the organic layer 133 may include a hole injection layer (HIL), a hole transporting layer (HTL), an emission layer (EML), an electron transporting layer (ETL), and an electron injection layer (EIL). Some of these layers may be combined, i.e. one or more functional layers may serve more than one function among hole injection, hole transporting, emission and electron transporting; however, the following description will assume each layer as being distinct, merely for explanation purposes.

The HIL is located on the first electrode 131. The HIL functions to smoothly inject holes. Further, the HIL may be formed of any one or more materials selected from the group consisting of HATCN and CuPc (copper phthalocyanine), PEDOT (poly(3,4)-ethylenedioxythiophene), PANI (polyaniline), and NPD (N,N-dinaphthyl-N,N'-diphenylbenzidine), but is not limited thereto.

The HTL is located on the HIL. The HTL functions to smoothly transport holes. Further, the HTL may be formed of any one or more materials selected from the group consisting of NPD (N,N-dinaphthyl-N,N'-diphenylbenzidine), TPD (N,N'-bis-(3-methylphenyl)-N,N'-bis-(phenyl)-benzidine), s-TAD, and MTDATA (4,4',4"-Tris(N-3-methylphenyl-N-phenyl-amino)-triphenylamine), but is not limited thereto.

The EML is located on the HTL and formed between the HTL and the ETL. Thus, the EML emits a white light by combination of holes supplied from the first electrode 131 and electrons supplied from the second electrode 134.

The ETL is located on the EML. A thickness of the ETL may be regulated considering the electron transporting characteristics. The ETL may function to transport and inject electrons. The EIL may be formed separately on the ETL.

The ETL functions to smoothly transport electrons. Further, the ETL may be formed of any one or more materials selected from the group consisting of Alq3 (tris(8-hydroxyquinolino)aluminum), PBD, TAZ, Spiro-PBD, BAlq, Liq (lithium quinolate), BMB-3T, PF-6P, TPBI, COT, and SAlq, but is not limited thereto.

The EIL may be formed using Alq3 (tris(8-hydroxyquinolino)aluminum), PBD, TAZ, Spiro-PBD, BAlq, or SAlq, but is not limited thereto.

Herein, the structure is not limited according to the exemplary embodiments of the present disclosure. At least any one of the HIL, the HTL, the ETL, and the EIL may be omitted, with such function being integrated or incorporated into some other layer.

Further, the HIL, the HTL, the ETL, and the EIL can be formed into two or more layers.

The second electrode 134 is formed on the entire surface of the organic layer 133, supplies electrons to the EML, and functions as a cathode. The second electrode 134 is formed of a transparent conductive material. For example, the transparent conductive material may include ITO or IZO.

Further, the second electrode 134 may further include a thin metal film formed of a metal material having a low work function on the side in contact with the organic layer 133. For example, the metal material may include magnesium (Mg), silver (Ag), and compounds thereof.

Further, in case of a top-emission organic light emitting display device, the second electrode 134 needs to have a low work function and satisfy a transflective property. Thus, the second electrode 134 needs to be formed thin.

Accordingly, in the emitting area EA of each pixel area PA, the organic light emitting element ED including the first electrode 131 and the second electrode 134 facing each other, and the organic layer 133 disposed between the first electrode 131 and the second electrode 134 is formed.

The sealing layer 150 is formed on the second electrode 134. The sealing layer 150 isolates the plurality of organic light emitting elements ED from the outside and shields the plurality of organic light emitting elements ED from infiltration of moisture and/or oxygen. Thus, the sealing layer 150 functions to delay degradation of the plurality of organic light emitting elements ED caused by moisture and/or oxygen.

A protective film and an encapsulation film may be formed between the second electrode 134 and the sealing layer 150. The encapsulation film suppresses infiltration of moisture and/or oxygen into an organic light emitting diode (OLED). The encapsulation film may be formed into a single layer of an inorganic insulation material such as aluminum oxide (AlOx), silicon nitride oxide (SiON), silicon nitride (SiNx), silicon oxide ($SiO_2$), etc. or an organic insulation material such as benzocyclobutene, photo acryl, etc. Otherwise, the encapsulation film may be formed into a structure in which an inorganic insulation material and an organic insulation material are laminated.

A color filter (CF) may be formed on the sealing layer 150. The CF is formed by depositing red, green, and blue pigments in a red sub-pixel area, a green sub-pixel area, and a blue sub-pixel area, respectively, and patterning them, and may include a black matrix (BM). Further, if a white sub-pixel area is included, a separate CF may or may not be formed in the white sub-pixel area.

Referring to FIG. 2 and FIG. 3, in the organic light emitting display device 100 according to an exemplary embodiment of the present disclosure, the auxiliary electrode 120 is formed as a single auxiliary electrode layer 121 on the same layer (i.e. same cross-sectional level) as one signal line of the gate lines GL and the data lines DL and insulated from the one signal line.

That is, the auxiliary electrode layer 121 may be formed together with the data lines DL, the source electrode 163, and the drain electrode 164 on the gate insulation film 112. Further, the auxiliary electrode layer 121 may have an island pattern insulated from each of the data lines DL, the source electrode 163, and the drain electrode 164. The auxiliary electrode layer 121 may have a line shape in parallel with the data lines DL.

Otherwise, an auxiliary electrode layer 121 may be formed together with the gate lines GL and the gate electrode 161 on the substrate 111 and may have an island pattern insulated from each of the gate lines GL and the gate electrode 161. In this case, the auxiliary electrode layer 121 may have a line shape in parallel with the gate lines GL. Further, an auxiliary contact hole CT2 for exposing a part of the auxiliary electrode 120 is formed by penetrating the gate insulation film 112 as well as the overcoating layer 113.

The part of the auxiliary electrode 120 exposed through the auxiliary contact hole CT2 faces the second electrode 134 with the organic layer 133 interposed therebetween.

Further, the auxiliary electrode contact portion 140 is formed within an area where the part of the auxiliary electrode layer 121 is exposed through the auxiliary contact hole CT2.

Specifically, the auxiliary electrode contact portion 140 is formed by spreading (or expanding) a part of the auxiliary electrode 120 to the second electrode 134 with a laser located outside a back surface of the substrate 111. That is, a laser emitted from a laser apparatus located outside the back surface of the substrate 111 and penetrates the substrate 111 is irradiated to a part of the auxiliary electrode 120. Through laser welding performed as such, the part of the auxiliary electrode 120 is melted and spread (or expanded) to the second electrode 134 through the organic layer 133. Thus, the auxiliary electrode contact portion 140 that electrically connects the auxiliary electrode 120 and the second electrode 134 is formed.

That is, in the organic light emitting display device 100 according to an exemplary embodiment of the present disclosure, the auxiliary electrode 120 and the second electrode 134 facing each other at least in part through the auxiliary contact hole CT2 with the organic layer 133 interposed therebetween may be connected to each other by the auxiliary electrode contact portion 140 through laser welding.

According to the above-described method, it is easy to electrically connect the auxiliary electrode 120 and the second electrode 134 through a simple process without selectively removing a part of the organic layer 133. Further, since the auxiliary electrode 120 and the second electrode 134 are electrically connected to each other, it is possible to reduce a resistance of the second electrode 134.

Further, referring to FIG. 3, the auxiliary electrode contact portion 140 may be disposed to be spaced away from the first electrode 131 such that a distance A from the center of the auxiliary electrode contact portion 140 to a terminal end of the first electrode 131 in the emitting area is 3 μm or more.

Further, the auxiliary electrode contact portion 140 may include an auxiliary electrode contact pad in order to readily bring the auxiliary electrode 120 into contact with the second electrode 134.

The auxiliary electrode contact portion 140 is spaced away from the emitting area at a distance of 3 μm or more. Thus, during a contact between the auxiliary electrode 120 and the second electrode 134 through laser welding, damages to an emitting area in a surrounding pixel area caused by high energy of the laser can be minimized. Therefore, occurrence of pixel defects in the organic light emitting display device can be minimized.

Figure 4:
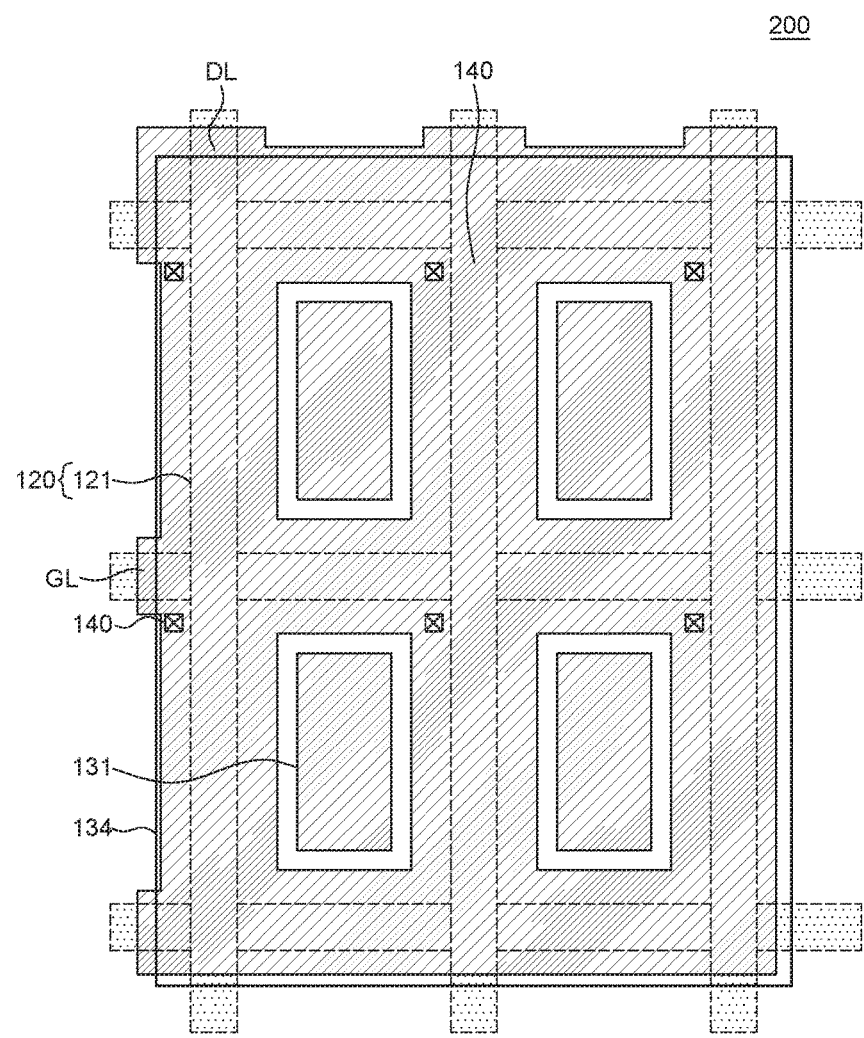
FIG. 4 is a plane view of an organic light emitting display device according to another exemplary embodiment of the present disclosure.

FIG. 4 is a plane view of an organic light emitting display device according to another exemplary embodiment of the present disclosure.

Figure 5:
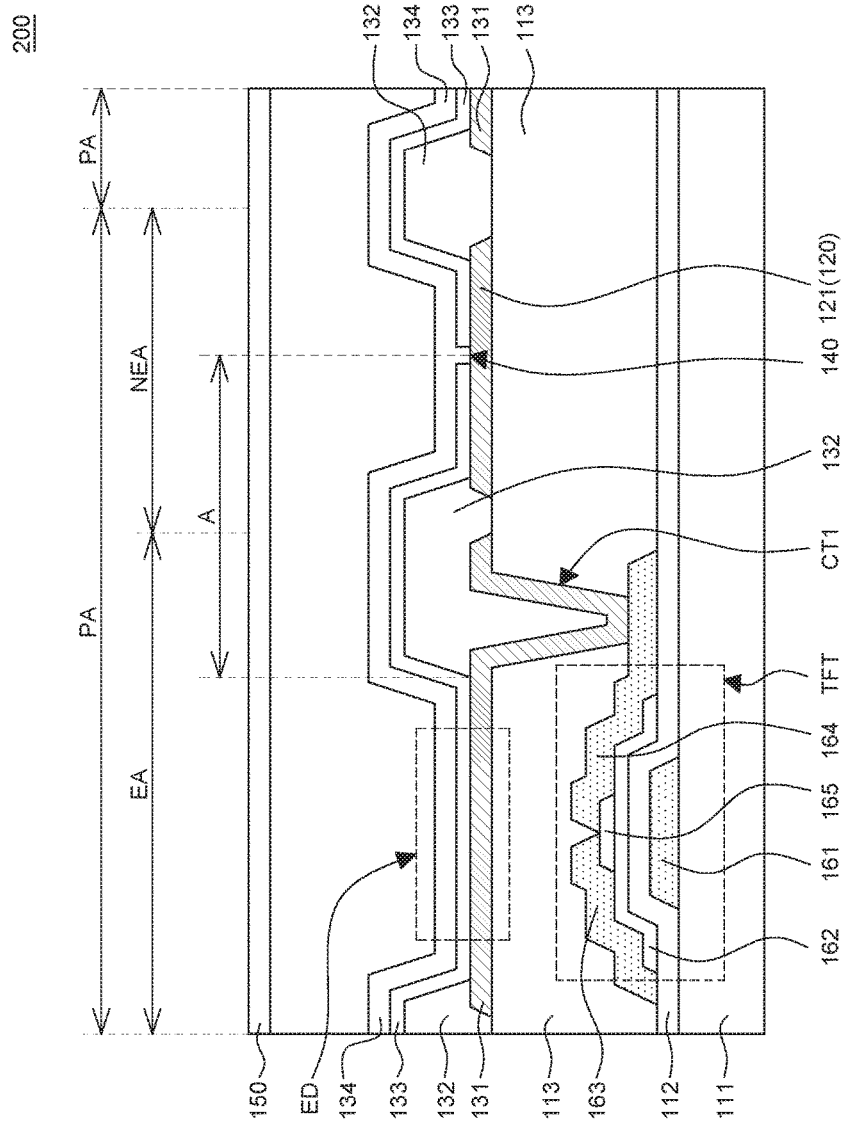
FIG. 5 is a diagram illustrating a cross-sectional structure of the organic light emitting display device according to another exemplary embodiment of the present disclosure illustrated in FIG. 4.

Further, FIG. 5 is a diagram illustrating a cross-sectional structure of the organic light emitting display device according to another exemplary embodiment of the present disclosure illustrated in FIG. 4.

In explaining the organic light emitting display device according to another exemplary embodiment of the present disclosure, detailed description of components identical or corresponding to those of the above-described exemplary embodiment will be omitted.

Referring to FIG. 4 and FIG. 5, in an organic light emitting display device 200 according to another exemplary embodiment of the present disclosure, the auxiliary electrode 120 may include an auxiliary electrode layer formed on a layer different from a layer on which any one signal line of the gate lines GL and the data lines DL is formed.

That is, referring to FIG. 5, the auxiliary electrode 120 of the organic light emitting display device 200 according to another exemplary embodiment of the present disclosure is formed as a single auxiliary electrode layer 122 on the same layer as the first electrode 131 and insulated from the first electrode 131.

Further, as illustrated in FIG. 4, the auxiliary electrode layer 122 may have a mesh shape spaced away from the first electrode 131 at a predetermined distance.

As such, in the organic light emitting display device 200 according to another exemplary embodiment of the present disclosure, the auxiliary electrode 120 may be formed as the single auxiliary electrode layer 122 on the overcoating layer 113. Further, the auxiliary electrode 120 and the second electrode 134 may be connected to each other by the auxiliary electrode contact portion 140 through laser welding.

Referring to FIG. 5, the auxiliary electrode contact portion 140 may be disposed to be spaced away from the first electrode 131 such that a distance A from the center of the auxiliary electrode contact portion 140 to the terminal end of the first electrode 131 in the emitting area is 3 μm or more.

The auxiliary electrode contact portion 140 is spaced away from the emitting area at a distance of 3 μm or more. Thus, during a contact between the auxiliary electrode 120 and the second electrode 134 through laser welding, damages to an emitting area in a surrounding pixel area caused by high energy of the laser can be minimized. Therefore, occurrence of pixel defects in the organic light emitting display device can be minimized.

Figure 6:
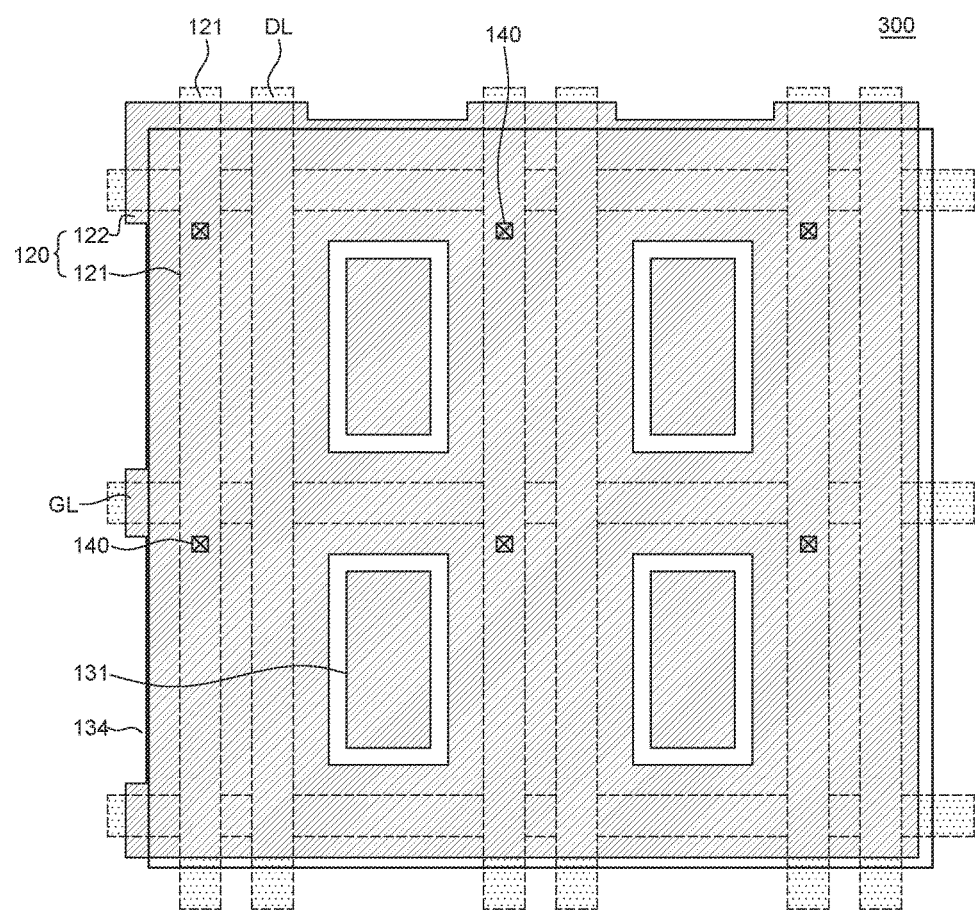
FIG. 6 is a plane view of an organic light emitting display device according to yet another exemplary embodiment of the present disclosure.

FIG. 6 is a plane view of an organic light emitting display device according to yet another exemplary embodiment of the present disclosure.

Figure 7:
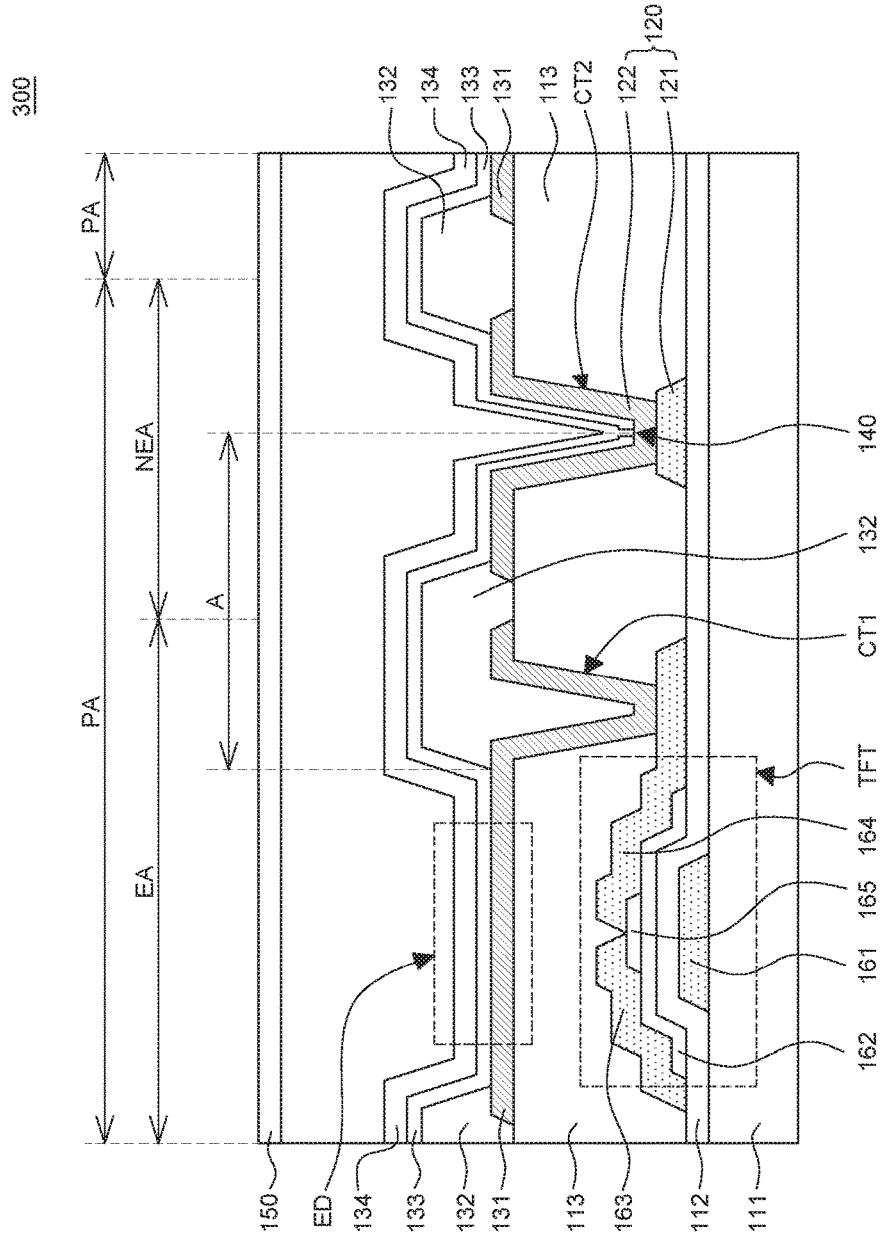
FIG. 7 is a diagram illustrating a cross-sectional structure of the organic light emitting display device according to yet another exemplary embodiment of the present disclosure illustrated in FIG. 6.

Further, FIG. 7 is a diagram illustrating a cross-sectional structure of the organic light emitting display device according to yet another exemplary embodiment of the present disclosure illustrated in FIG. 6.

In explaining the organic light emitting display device according to yet another exemplary embodiment of the present disclosure, detailed description of components identical or corresponding to those of the above-described exemplary embodiments will be omitted.

Referring to FIG. 6 and FIG. 7, in an organic light emitting display device 300 according to yet another exemplary embodiment of the present disclosure, the auxiliary electrode 120 may include two electrode layers respectively formed on different layers.

As illustrated in FIG. 7, the auxiliary electrode 120 of the organic light emitting display device 300 according to yet another exemplary embodiment of the present disclosure includes a first auxiliary electrode layer 121 formed on the same layer as any one signal line of the gate lines GL and the data lines DL and a second auxiliary electrode layer 122 formed on the same layer as the first electrode 131.

That is, the auxiliary electrode 120 includes the first auxiliary electrode layer 121 formed on any one of the substrate 111 and the gate insulation film 112 and the second auxiliary electrode layer 122 formed on the overcoating layer 113.

Herein, the second auxiliary electrode layer 122 is connected to the first auxiliary electrode layer 121 as being in contact with the first auxiliary electrode layer 121 exposed through the auxiliary contact hole CT2.

In this case, the auxiliary electrode contact portion 140 may be formed by spreading (or expanding) an overlap part between the first auxiliary electrode layer 121 and the second auxiliary electrode layer 122 within the auxiliary contact hole CT2.

Further, the auxiliary electrode contact portion 140 may be formed at a distance corresponding to two or more pixel areas PA.

As such, in the organic light emitting display device 300 according to yet another exemplary embodiment of the present disclosure, the auxiliary electrode 120 may include the first auxiliary electrode layer 121 formed on any one of the substrate 111 and the gate insulation film 112 and the second auxiliary electrode layer 122 formed on the overcoating layer 113. Further, the auxiliary electrode 120 and the second electrode 134 may be connected to each other by the auxiliary electrode contact portion 140 through laser welding.

Referring to FIG. 7, the auxiliary electrode contact portion 140 may be disposed to be spaced away from the first electrode 131 such that a distance A from the center of the auxiliary electrode contact portion 140 to the terminal end of the first electrode 131 in the emitting area is 3 μm or more.

The auxiliary electrode contact portion 140 is spaced away from the emitting area at a distance of 3 μm or more. Thus, during a contact between the auxiliary electrode 120 and the second electrode 134 through laser welding, damages to an emitting area in a surrounding pixel area caused by high energy of the laser can be minimized. Therefore, occurrence of pixel defects in the organic light emitting display device can be minimized.

Figure 8:
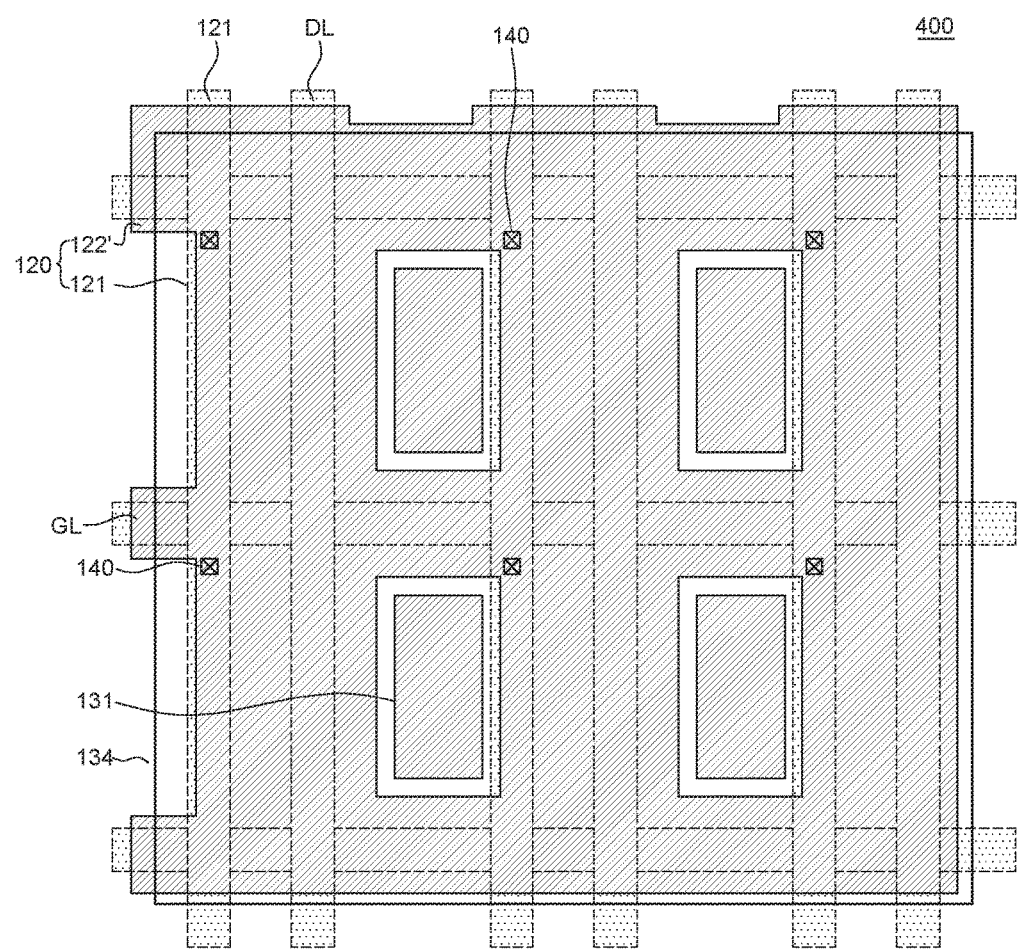
FIG. 8 is a plane view of an organic light emitting display device according to still another exemplary embodiment of the present disclosure.

FIG. 8 is a plane view of an organic light emitting display device according to still another exemplary embodiment of the present disclosure.

Figure 9:
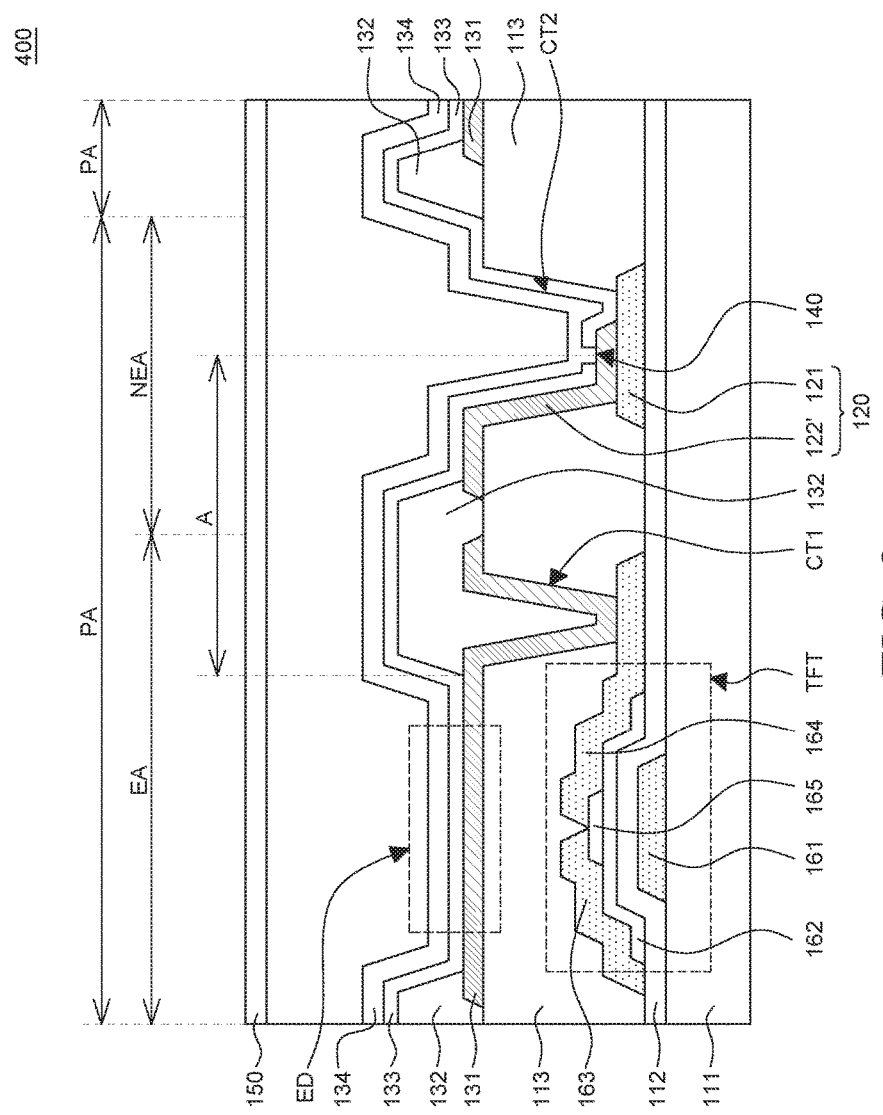
FIG. 9 is a diagram illustrating a cross-sectional structure of the organic light emitting display device according to still another exemplary embodiment of the present disclosure illustrated in FIG. 8.

FIG. 9 is a diagram illustrating a cross-sectional structure of the organic light emitting display device according to still another exemplary embodiment of the present disclosure illustrated in FIG. 8.

In explaining the organic light emitting display device according to still another exemplary embodiment of the present disclosure, detailed description of components identical or corresponding to those of the above-described exemplary embodiments will be omitted.

Referring to FIG. 8 and FIG. 9, in an organic light emitting display device 400 according to still another exemplary embodiment of the present disclosure, a second auxiliary electrode layer 122' may be formed to be partially in contact with a part of the first auxiliary electrode layer 121 exposed through the auxiliary contact hole CT2.

That is, as illustrated in FIG. 9, a part of the first auxiliary electrode layer 121 of the organic light emitting display device 400 according to still another exemplary embodiment of the present disclosure is exposed through the auxiliary contact hole CT2. Further, the second auxiliary electrode layer 122' is formed not to be entirely but to be partially in contact with the part of the first auxiliary electrode layer 121 exposed through the auxiliary contact hole CT2. Further, in the part of the first auxiliary electrode layer 121 exposed through the auxiliary contact hole CT2, a portion which is not in contact with the auxiliary electrode layer is in contact with the organic layer 133.

Further, the auxiliary electrode contact portion 140 may be formed at an overlap part between the first auxiliary electrode layer 121 and the second auxiliary electrode layer 122' within an area where the part of the first auxiliary electrode layer 121 is exposed through the auxiliary contact hole CT2.

As such, in an organic light emitting display device 100d according to a fourth exemplary embodiment of the present disclosure, the first and second auxiliary electrode layers 121 and 122 are not entirely but partially in contact within the auxiliary contact hole CT2. Further, the auxiliary electrode contact portion 140 is formed at the overlap part between the first auxiliary electrode layer 121 and the second auxiliary electrode layer 122'. That is, the first auxiliary electrode layer 121 is in contact with the second auxiliary electrode layer 122' and the second auxiliary electrode layer 122' is in contact with the second electrode 134 by the auxiliary electrode contact portion 140. Thus, the auxiliary electrode 120 and the second electrode 134 may be connected to each other by the auxiliary electrode contact portion 140 through laser welding.

Referring to FIG. 9, the auxiliary electrode contact portion 140 may be disposed to be spaced away from the first electrode 131 such that a distance A from the center of the auxiliary electrode contact portion 140 to the terminal end of the first electrode 131 in the emitting area is 3 μm or more.

The auxiliary electrode contact portion 140 is spaced away from the emitting area at a distance of 3 μm or more. Thus, during a contact between the auxiliary electrode 120 and the second electrode 134 through laser welding, damages to an emitting area in a surrounding pixel area caused by high energy of the laser can be minimized. Therefore, occurrence of pixel defects in the organic light emitting display device can be minimized.

Figure 10:
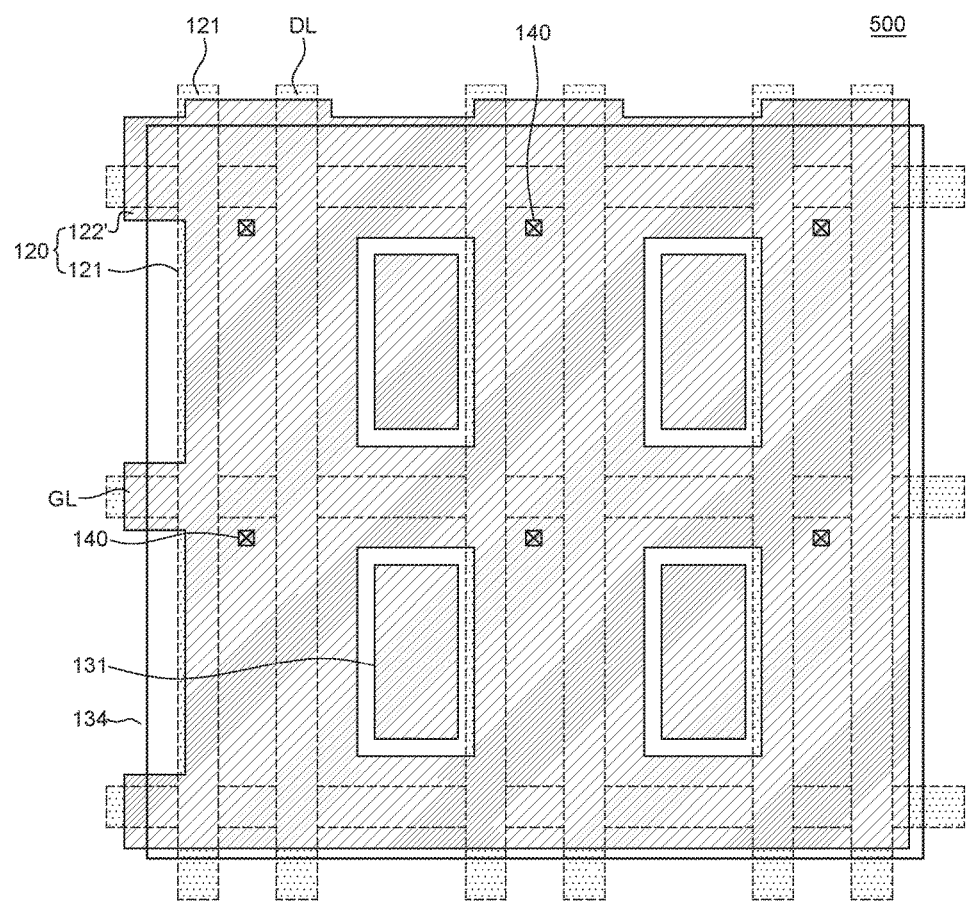
FIG. 10 is a plane view of an organic light emitting display device according to still another exemplary embodiment of the present disclosure.

FIG. 10 is a plane view of an organic light emitting display device according to still another exemplary embodiment of the present disclosure.

Figure 11:
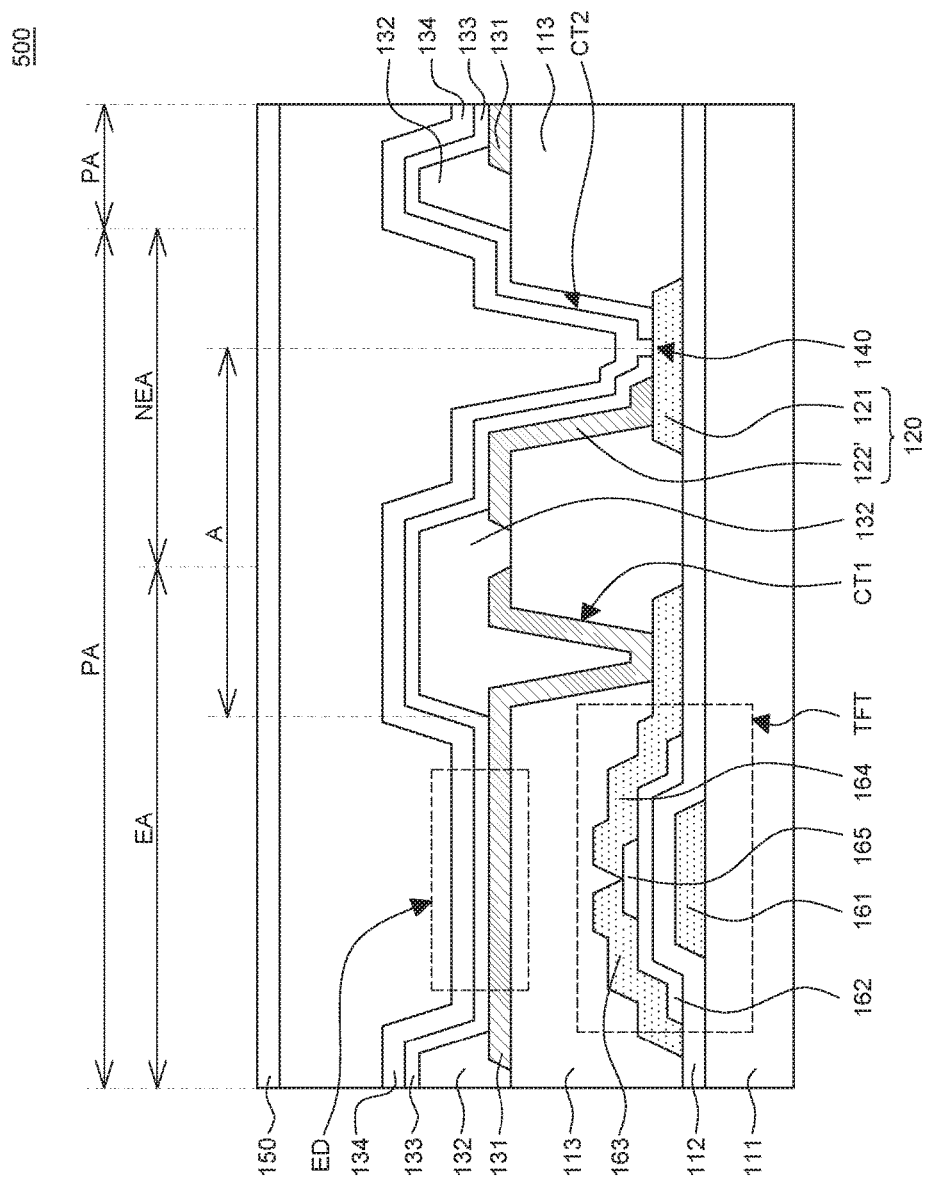
FIG. 11 is a diagram illustrating a cross-sectional structure of the organic light emitting display device according to still another exemplary embodiment of the present disclosure illustrated in FIG. 10.

Further, FIG. 11 is a diagram illustrating a cross-sectional structure of the organic light emitting display device according to still another exemplary embodiment of the present disclosure illustrated in FIG. 10.

In explaining the organic light emitting display device according to still another exemplary embodiment of the present disclosure, detailed description of components identical or corresponding to those of the above-described exemplary embodiments will be omitted.

Referring to FIG. 10 and FIG. 11, in an organic light emitting display device 500 according to still another exemplary embodiment of the present disclosure, the auxiliary electrode contact portion 140 may be formed at an overlap part between the first auxiliary electrode layer 121 and the second electrode 134 within an area where the part of the first auxiliary electrode layer 121 is exposed through the auxiliary contact hole CT2.

That is, the second auxiliary electrode layer 122' is formed to be partially in contact with the part of the first auxiliary electrode layer 121 exposed through the auxiliary contact hole CT2. Thus, in the part of the first auxiliary electrode layer 121 exposed through the auxiliary contact hole CT2, a portion which is not in contact with the second auxiliary electrode layer 122' is in contact with the organic layer 133.

Thus, the auxiliary electrode contact portion 140 may be formed in an area where the first auxiliary electrode 121 and the second electrode 134 face each other with the organic layer 133 interposed therebetween within the auxiliary contact hole CT2.

As such, in the organic light emitting display device 500 according to still another exemplary embodiment of the present disclosure, the auxiliary electrode contact portion 140 is formed at the overlap part between the first auxiliary electrode layer 121 and the second electrode 134 within the area where the part of the first auxiliary electrode layer 121 is exposed through the auxiliary contact hole CT2. That is, the first auxiliary electrode layer 121 is in contact with the second auxiliary electrode layer 122' and the first auxiliary electrode layer 121 is in contact with the second electrode 134 by the auxiliary electrode contact portion 140. Thus, the auxiliary electrode 120 and the second electrode 134 may be connected to each other by the auxiliary electrode contact portion 140 through laser welding.

Further, referring to FIG. 11, the auxiliary electrode contact portion 140 may be disposed to be spaced away from the first electrode 131 such that a distance A from the center of the auxiliary electrode contact portion 140 to the terminal end of the first electrode 131 in the emitting area is 3 μm or more.

The auxiliary electrode contact portion 140 is spaced away from the emitting area at a distance of 3 μm or more. Thus, during a contact between the auxiliary electrode 120 and the second electrode 134 through laser welding, damages to an emitting area in a surrounding pixel area caused by high energy of the laser can be minimized. Therefore, occurrence of pixel defects in the organic light emitting display device can be minimized.

Figure 12:
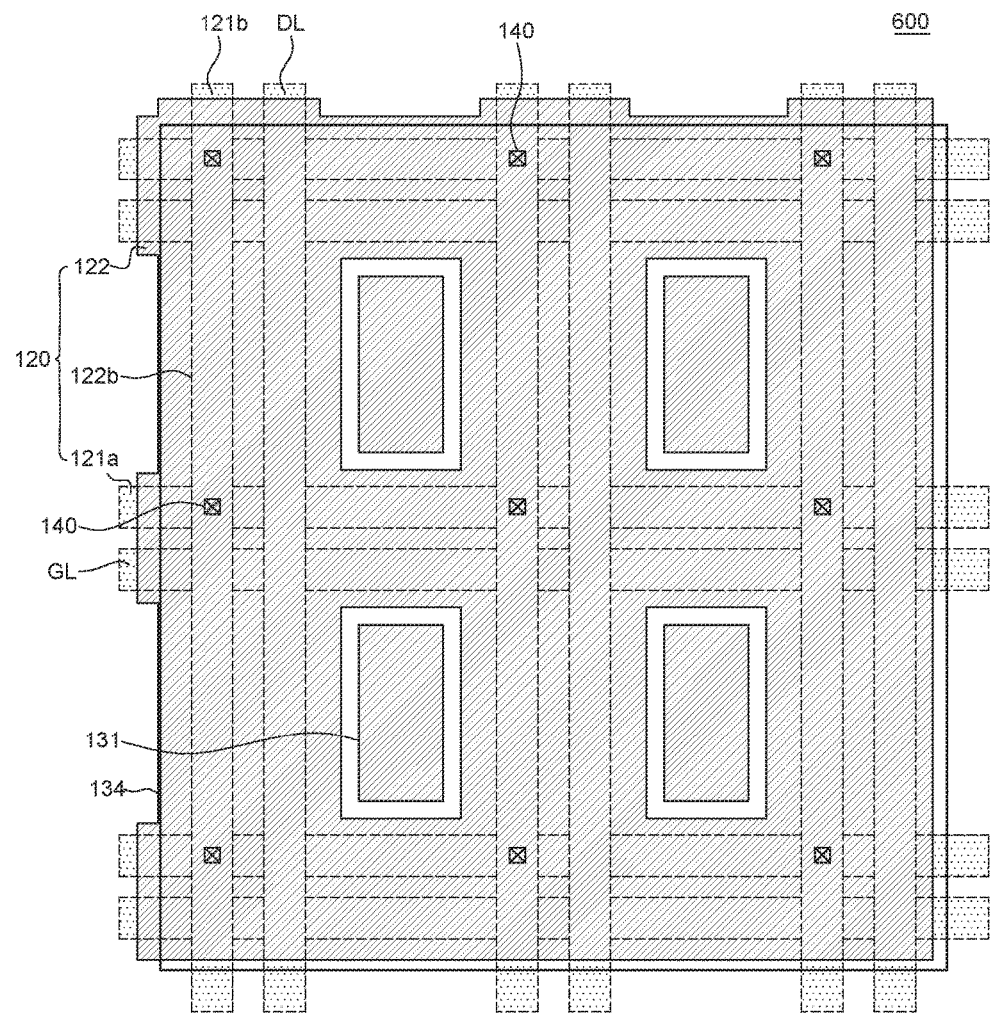
FIG. 12 is a plane view of an organic light emitting display device according to still another exemplary embodiment of the present disclosure.

FIG. 12 is a plane view of an organic light emitting display device according to still another exemplary embodiment of the present disclosure.

Figure 13:
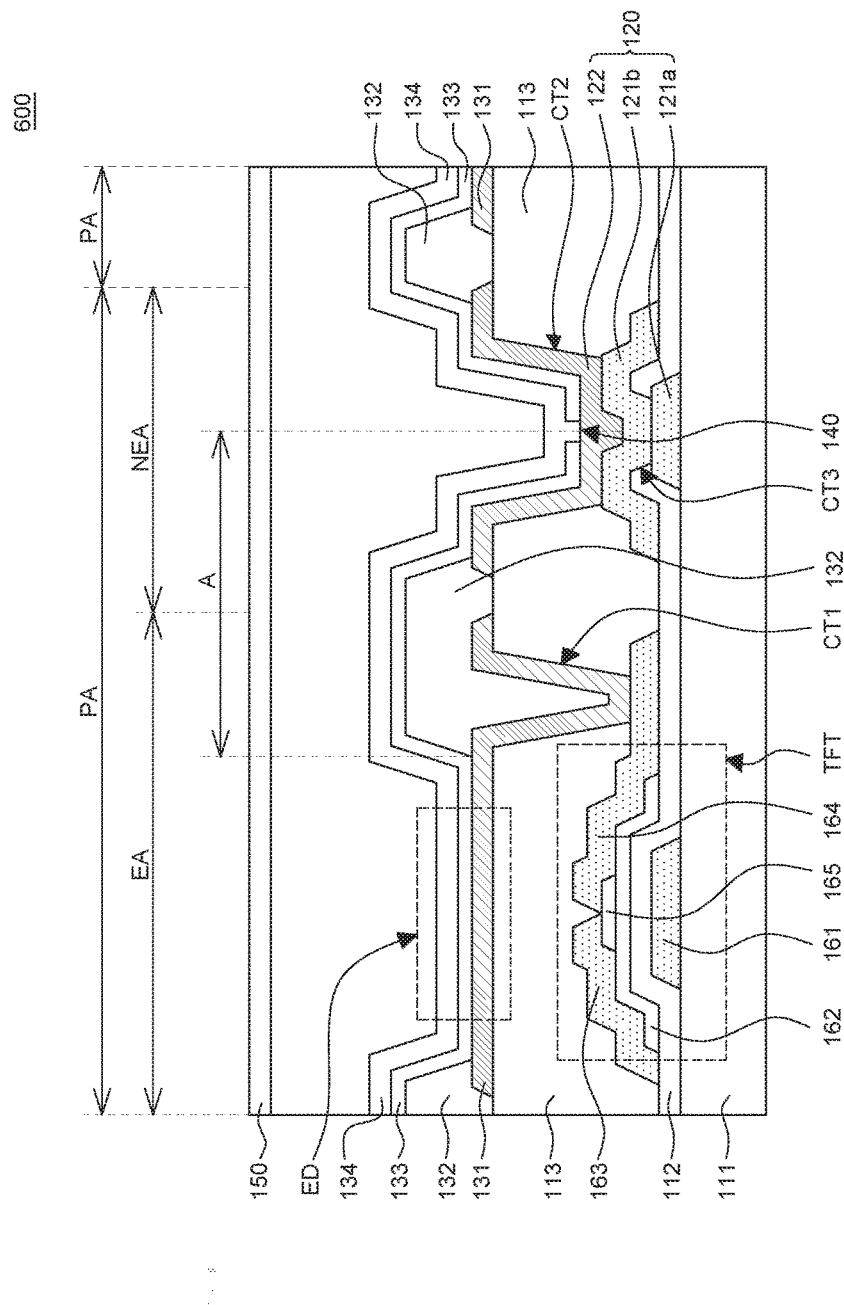
FIG. 13 is a diagram illustrating a cross-sectional structure of the organic light emitting display device according to still another exemplary embodiment of the present disclosure illustrated in FIG. 12.

Further, FIG. 13 is a diagram illustrating a cross-sectional structure of the organic light emitting display device according to still another exemplary embodiment of the present disclosure illustrated in FIG. 12.

In explaining the organic light emitting display device according to still another exemplary embodiment of the present disclosure, detailed description of components identical or corresponding to those of the above-described exemplary embodiments will be omitted.

Referring to FIG. 12 and FIG. 13, in an organic light emitting display device 600 according to still another exemplary embodiment of the present disclosure, the auxiliary electrode 120 may include three electrode layers respectively formed on different layers.

As illustrated in FIG. 13, the auxiliary electrode 120 of the organic light emitting display device 600 according to still another exemplary embodiment of the present disclosure includes: a first auxiliary electrode layer 121a formed on the same layer as the gate lines GL; a third auxiliary electrode layer 121b formed on the same layer as the data lines DL; and a second auxiliary electrode layer 122 formed into a mesh or grid-like shape on the same layer as the first electrode 131.

Herein, the first and third auxiliary electrode layers 121a and 121b may be connected to each other through a pre-contact hole CT3 penetrating the gate insulation film 112.

Further, the auxiliary electrode contact portion 140 may be formed at an overlap part among the first auxiliary electrode layer 121a, the second auxiliary electrode layer 122, and the third auxiliary electrode layer 121b within the auxiliary contact hole CT2.

As described above, if the auxiliary electrode 120 is formed into a multilayer, a resistance of the second electrode 134 can be reduced.

That is, in the organic light emitting display device 600 according to still another exemplary embodiment of the present disclosure, the auxiliary electrode 120 includes the first auxiliary electrode layer 121a, the second auxiliary electrode layer 122, the third auxiliary electrode layer 121b respectively formed on different layers. That is, the first auxiliary electrode layer 121a is in contact with the third auxiliary electrode layers 121b and the third auxiliary electrode layers 121b is in contact with the second auxiliary electrode layer 122 and the second auxiliary electrode layer 122 is in contact with the second electrode 134 by the auxiliary electrode contact portion 140. Thus, the auxiliary electrode 120 and the second electrode 134 may be connected to each other by the auxiliary electrode contact portion 140 through laser welding.

Further, referring to FIG. 13, the auxiliary electrode contact portion 140 may be disposed to be spaced away from the first electrode 131 such that a distance A from the center of the auxiliary electrode contact portion 140 to the terminal end of the first electrode 131 in the emitting area is 3 μm or more.

The auxiliary electrode contact portion 140 is spaced away from the emitting area at a distance of 3 μm or more. Thus, during a contact between the auxiliary electrode 120 and the second electrode 134 through laser welding, damages to an emitting area in a surrounding pixel area caused by high energy of the laser can be minimized. Therefore, occurrence of pixel defects in the organic light emitting display device can be minimized.

Figure 14:
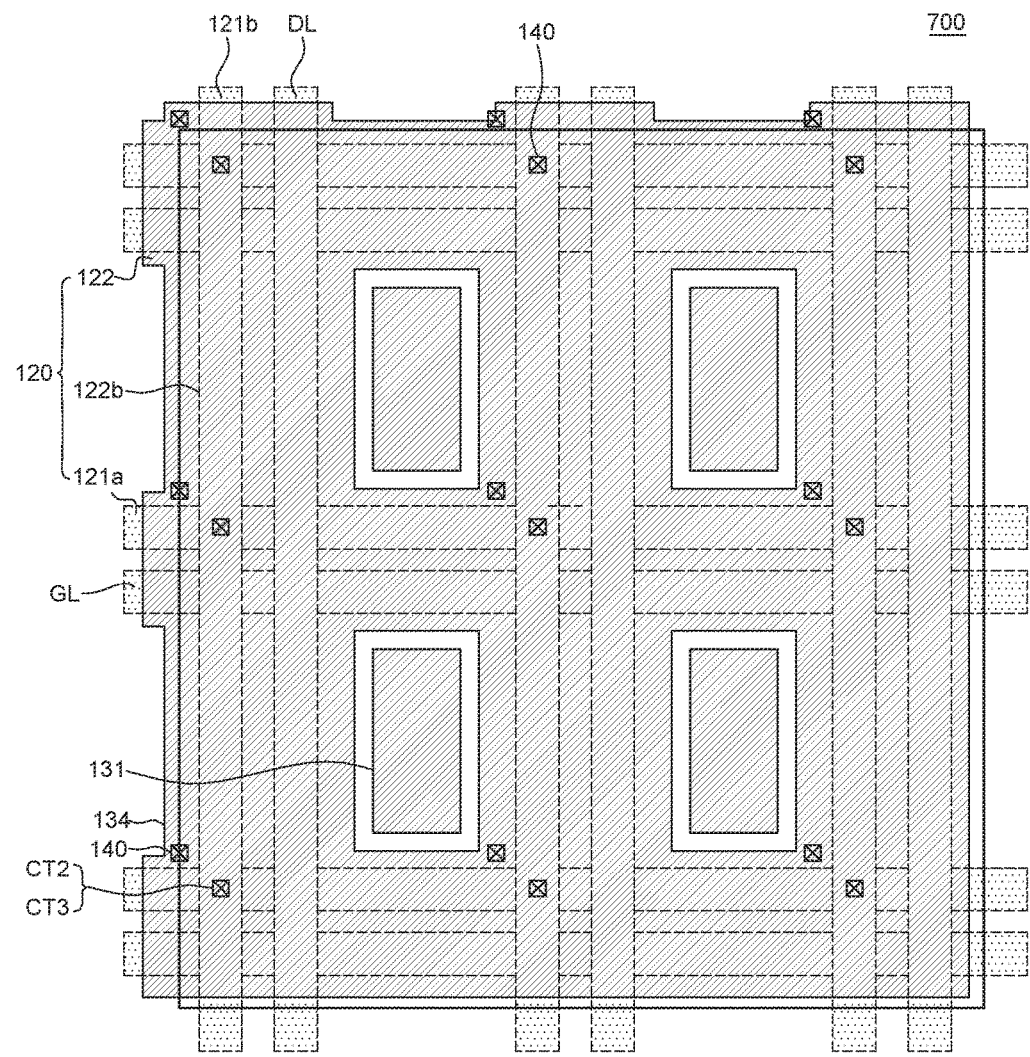
FIG. 14 is a plane view of an organic light emitting display device according to still another exemplary embodiment of the present disclosure.

FIG. 14 is a plane view of an organic light emitting display device according to still another exemplary embodiment of the present disclosure.

Figure 15:
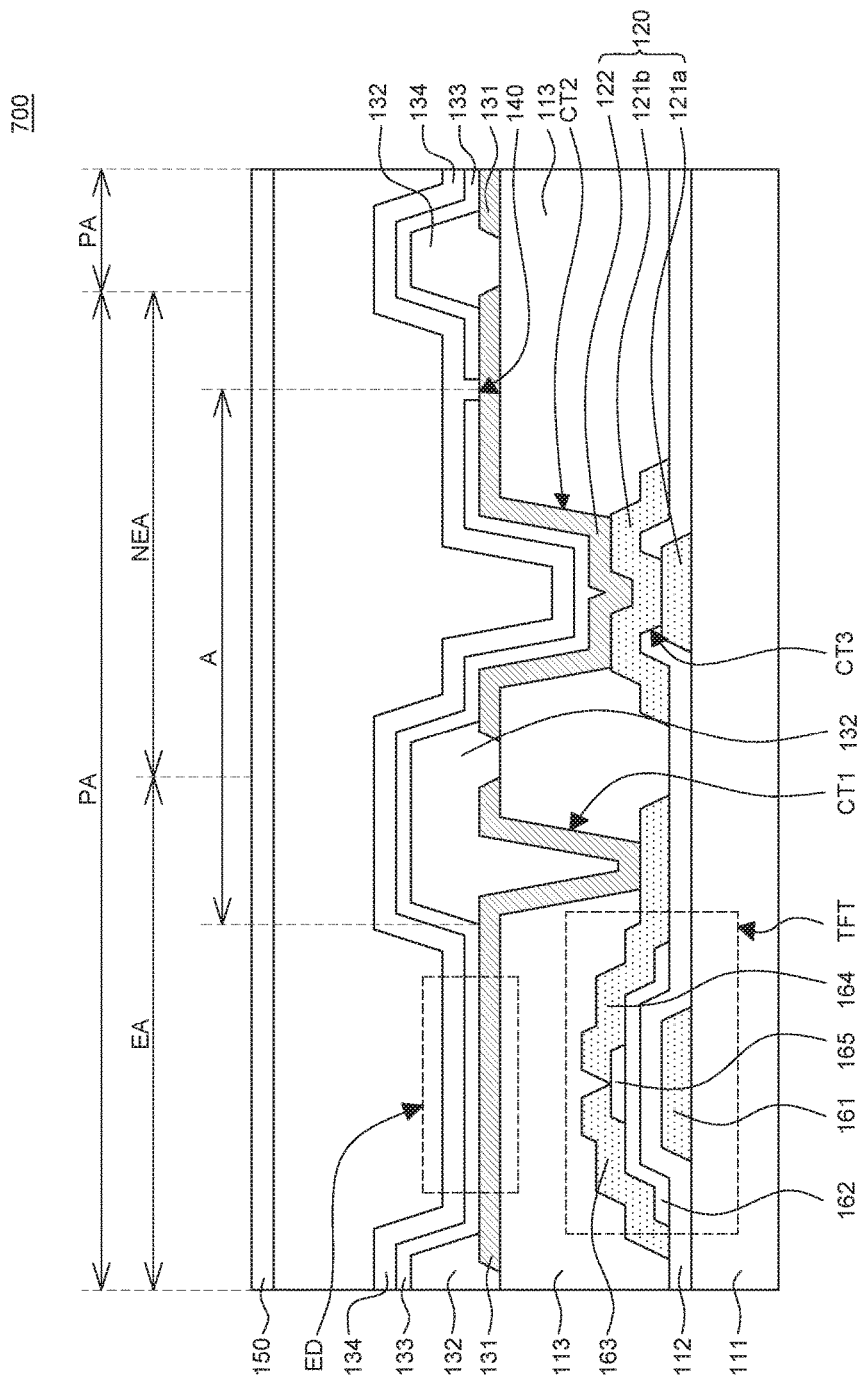
FIG. 15 is a diagram illustrating a cross-sectional structure of the organic light emitting display device according to still another exemplary embodiment of the present disclosure illustrated in FIG. 14.

Further, FIG. 15 is a diagram illustrating a cross-sectional structure of the organic light emitting display device according to still another exemplary embodiment of the present disclosure illustrated in FIG. 14.

In explaining the organic light emitting display device according to still another exemplary embodiment of the present disclosure, detailed description of components identical or corresponding to those of the above-described exemplary embodiments will be omitted.

Referring to FIG. 14 and FIG. 15, in an organic light emitting display device 700 according to still another exemplary embodiment of the present disclosure, the auxiliary electrode contact portion 140 may be formed in an area which does not correspond to the auxiliary contact hole CT2.

That is, as illustrated in FIG. 15, the auxiliary electrode contact portion 140 of the organic light emitting display device 700 according to still another exemplary embodiment of the present disclosure may be formed at an overlap part between the second auxiliary electrode layer 122 and the second electrode 134 around the auxiliary contact hole CT2. In this case, an area for the auxiliary electrode contact portion 140 is not limited to be within the auxiliary contact hole CT2. Therefore, it is possible to reduce fabrication errors.

Herein, the first and third auxiliary electrode layers 121a and 121b may be connected to each other through a pre-contact hole CT3 penetrating the gate insulation film 112.

The first auxiliary electrode layer 121a is in contact with the third auxiliary electrode layers 121b and the third auxiliary electrode layers 121b is in contact with the second auxiliary electrode layer 122 and the second auxiliary electrode layer 122 is in contact with the second electrode 134 by the auxiliary electrode contact portion 140.

That is, in the organic light emitting display device 700 according to still another exemplary embodiment of the present disclosure, the auxiliary electrode contact portion 140 is formed at the overlap part between the second auxiliary electrode layer 122 and the second electrode 134 around the auxiliary contact hole CT2. Thus, the auxiliary electrode 120 and the second electrode 134 may be connected to each other by the auxiliary electrode contact portion 140 through laser welding.

Referring to FIG. 15, the auxiliary electrode contact portion 140 may be disposed to be spaced away from the first electrode 131 such that a distance A from the center of the auxiliary electrode contact portion 140 to the terminal end of the first electrode 131 in the emitting area is 3 µm or more.

The auxiliary electrode contact portion 140 is spaced away from the emitting area at a distance of 3 µm or more. Thus, during a contact between the auxiliary electrode 120 and the second electrode 134 through laser welding, damages to an emitting area in a surrounding pixel area caused by high energy of the laser can be minimized. Therefore, occurrence of pixel defects in the organic light emitting display device can be minimized.

Figure 16:
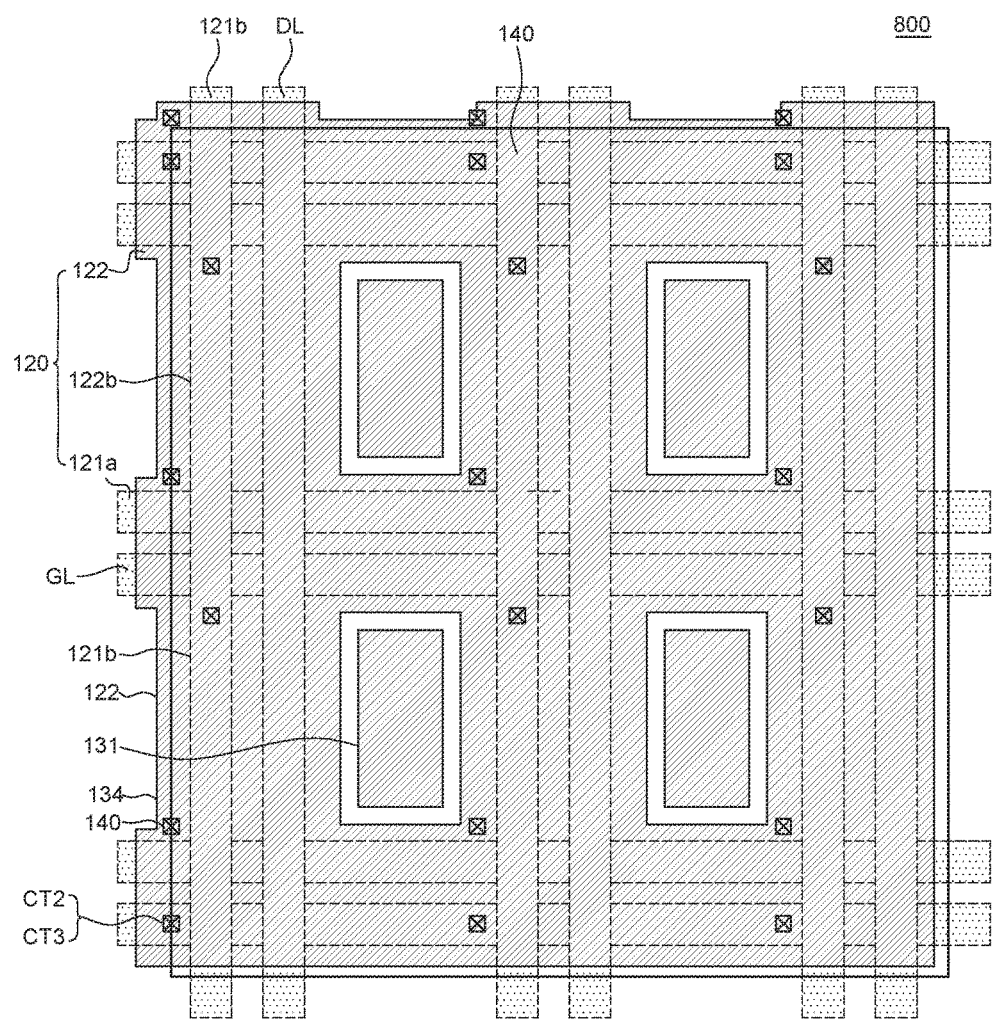
FIG. 16 is a plane view of an organic light emitting display device according to still another exemplary embodiment of the present disclosure.

FIG. 16 is a plane view of an organic light emitting display device according to still another exemplary embodiment of the present disclosure.

Figure 17:
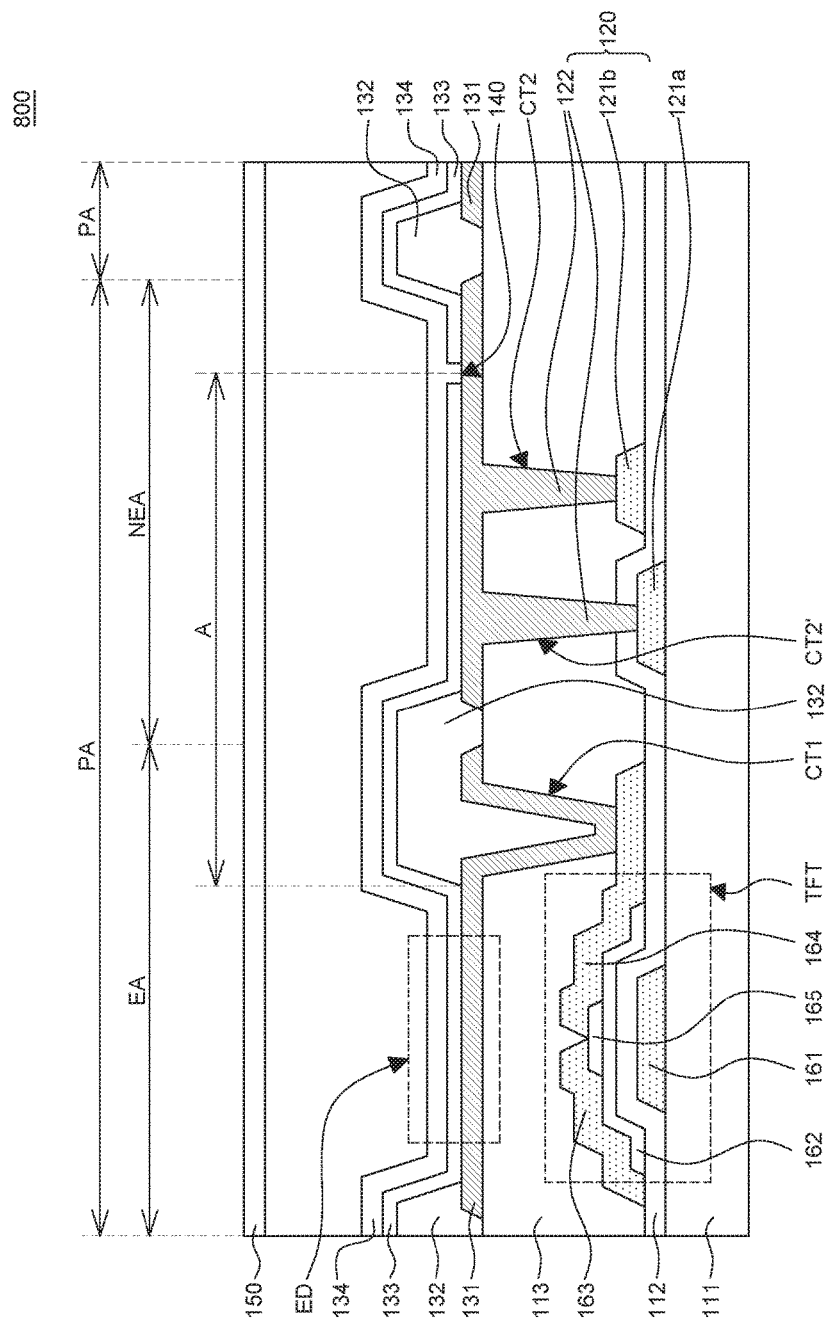
FIG. 17 is a diagram illustrating a cross-sectional structure of the organic light emitting display device according to still another exemplary embodiment of the present disclosure illustrated in FIG. 16.

Further, FIG. 17 is a diagram illustrating a cross-sectional structure of the organic light emitting display device according to still another exemplary embodiment of the present disclosure illustrated in FIG. 16.

In explaining the organic light emitting display device according to still another exemplary embodiment of the present disclosure, detailed description of components identical or corresponding to those of the above-described exemplary embodiments will be omitted.

Referring to FIG. 16 and FIG. 17, in an organic light emitting display device 800 according to still another exemplary embodiment of the present disclosure, the pre-contact hole CT3 for connecting the first auxiliary electrode layer 121a and the third auxiliary electrode layer 121b to each other may be omitted.

That is, as illustrated in FIG. 17, the organic light emitting display device 800 according to still another exemplary embodiment of the present disclosure may include a first auxiliary contact hole CT2' and a second auxiliary contact hole CT2 for exposing parts of the first auxiliary electrode layer 121a and the third auxiliary electrode layer 121b, respectively. Herein, the first auxiliary electrode layer 121a and the third auxiliary electrode layer 121b may be connected to the second auxiliary electrode layer 122 through the first auxiliary contact hole CT2' and the second auxiliary contact hole CT2, respectively.

Further, the auxiliary electrode contact portion 140 may be formed at an overlap part between the second auxiliary electrode layer 122 and the second electrode 134 around the first auxiliary contact hole CT2' and the second contact hole CT2.

That is, the organic light emitting display device 800 according to still another exemplary embodiment of the present disclosure does not include the pre-contact hole CT3 for connecting the first auxiliary electrode layer 121a and the third auxiliary electrode layer 121b to each other. Instead, the organic light emitting display device 800 includes the first auxiliary contact hole CT2' and the second contact hole CT2 for connecting the first auxiliary electrode layer 121a and the third auxiliary electrode layer 121b to the second auxiliary electrode layer 122, respectively. Further, the auxiliary electrode contact portion 140 is formed at the overlap part between the second auxiliary electrode layer 122 and the second electrode 134 around the first auxiliary contact hole CT2' and the second contact hole CT2. That is, the first auxiliary electrode layer 121a is in contact with the second auxiliary electrode layer 122 and the third auxiliary electrode layers 121b is in contact with the second auxiliary electrode layer 122 and the second auxiliary electrode layer 122 is in contact with the second electrode 134 by the auxiliary electrode contact portion 140. Thus, the auxiliary electrode 120 and the second electrode 134 may be connected to each other by the auxiliary electrode contact portion 140 through laser welding.

Further, referring to FIG. 17, the auxiliary electrode contact portion 140 may be disposed to be spaced away from the first electrode 131 such that a distance A from the center of the auxiliary electrode contact portion 140 to the terminal end of the first electrode 131 in the emitting area is 3 µm or more.

The auxiliary electrode contact portion 140 is spaced away from the emitting area at a distance of 3 µm or more. Thus, during a contact between the auxiliary electrode 120 and the second electrode 134 through laser welding, damages to an emitting area in a surrounding pixel area caused by high energy of the laser can be minimized. Therefore, occurrence of pixel defects in the organic light emitting display device can be minimized.

The exemplary embodiments of the present disclosure can also be described as follows:

According to an aspect of the present disclosure, there is provided an organic light emitting display device in which a plurality of pixel areas each including an emitting area and a non-emitting area is defined in a display area. The organic light emitting display device includes: an auxiliary electrode in a part of the non-emitting areas of the plurality of pixel areas; an auxiliary electrode contact portion formed as a part of the auxiliary electrode; a first electrode in the emitting areas of the plurality of pixel areas; an organic layer on the first electrode and the auxiliary electrode; and a second electrode on the organic layer. The auxiliary electrode contact portion electrically connects the auxiliary electrode and the second electrode. A distance from a center of the auxiliary electrode contact portion to a terminal end of the first electrode in the emitting area is 3 µm or more.

The organic light emitting display device further includes: a substrate; a gate line on the substrate; a gate insulation film on the gate line; and a data line on the gate insulation film and intersecting with the gate line. The auxiliary electrode may include a first auxiliary electrode layer on the same layer as any one of lines among the gate line and the data line and having an island pattern to be insulated from the any one of lines.

The organic light emitting display device further includes: an overcoating layer on the gate line, the data line, and the first auxiliary electrode layer and including at least one auxiliary contact hole. The first electrode may be on the overcoating layer.

The auxiliary electrode may include a second auxiliary electrode layer insulated from the first electrode on the same layer as the first electrode and connected to at least a part of the first auxiliary electrode layer through the auxiliary contact hole.

The auxiliary contact hole may be located corresponding to the auxiliary electrode contact portion. The auxiliary electrode contact portion may be at an overlap area between the first auxiliary electrode layer and the second auxiliary electrode layer.

The auxiliary contact hole may be located corresponding to the auxiliary electrode contact portion. The auxiliary electrode contact portion may be at an overlap area between the first auxiliary electrode layer and the second electrode.

The auxiliary electrode may further include a third auxiliary electrode layer on the same layer as the data line and electrically connected to the first auxiliary electrode layer. The first auxiliary electrode layer may be in a line pattern in parallel with the gate line on the same layer as the gate line. The second auxiliary electrode layer may be connected to at least a part of the third auxiliary electrode layer through the auxiliary contact hole.

The auxiliary contact hole may be located corresponding to the auxiliary electrode contact portion. The auxiliary electrode contact portion may be at an overlap area among the first auxiliary electrode layer, the second auxiliary electrode layer, and the third auxiliary electrode layer.

The auxiliary electrode contact portion may be located around the auxiliary contact hole. The auxiliary electrode contact portion may be at an overlap area between the second auxiliary electrode layer and the second electrode.

The auxiliary electrode may further include a third auxiliary electrode layer in a line pattern in parallel with the data line on the same layer as the data line. The first auxiliary electrode layer may be in a line pattern in parallel with the gate line on the same layer as the gate line. The second auxiliary electrode layer may be connected to at least a part of the first auxiliary electrode layer through a first auxiliary contact hole and connected to at least a part of the third auxiliary electrode layer through a second auxiliary contact hole.

The auxiliary electrode contact portion may be located around the first auxiliary contact hole and the second auxiliary contact hole. The auxiliary electrode contact portion may be at an overlap area between the second auxiliary electrode layer and the second electrode.

The auxiliary electrode may include a first auxiliary electrode layer on the same layer as the first electrode so as to be insulated from the first electrode.

The emitting area may be defined by a bank layer located on the first electrode.

The auxiliary electrode contact portion may include an auxiliary electrode contact pad that provides contact between the auxiliary electrode and the second electrode.

The auxiliary electrode and the second electrode may be electrically connected to each other as a result of laser irradiation applied on the auxiliary electrode contact portion.

The auxiliary electrode contact portion is spaced away from the emitting area, and, thus, pixel defects caused by laser energy is minimized during a contact between the auxiliary electrode and the second electrode by laser welding.

According to another aspect of the present disclosure, there is provided an apparatus comprising: a substrate having a plurality of pixels, each pixel including a light emitting area and a non-emitting area, an auxiliary electrode in the non-emitting areas, said auxiliary electrode having a contact portion; and an organic light emitting structure, in the light emitting areas, having an organic layer sandwiched between a cathode and an anode, and at least a portion of said organic layer on said auxiliary electrode, said contact portion of said auxiliary electrode is configured to electrically connect said auxiliary electrode with said cathode, and is configured to be at a specific distance away from said light emitting area, said specific distance being sufficient to minimize damage caused by heat or energy used in connecting said auxiliary electrode with said cathode.

The heat or energy may be from laser welding used in connecting said auxiliary electrode with said cathode.

The specific distance bay be based upon characteristics of at least one among a laser used in said laser welding, said substrate, said auxiliary electrode, and said organic light emitting structure.

The specific distance mat be that from a center of said contact portion of said auxiliary electrode to a terminal end of said anode.

In accordance with the foregoing, in the organic light emitting display device according to an exemplary embodiment of the present disclosure, the distance from the center of the auxiliary electrode contact portion to the terminal end of the first electrode in the emitting area may be 3 µm or more. Thus, during a contact between the auxiliary electrode and the second electrode through laser welding performed by irradiating a laser to the auxiliary electrode contact portion, it is possible to minimize damages to an emitting area in a surrounding pixel area caused by the laser. Therefore, it is possible to minimize occurrence of pixel defects in the organic light emitting display device.

Further, in the organic light emitting display device according to an exemplary embodiment of the present disclosure, a resistance of the second electrode may be reduced by applying the auxiliary electrode electrically connected to the second electrode. Thus, it is possible to reduce power consumption of the organic light emitting display device and also possible to improve the luminance uniformity thereof.

It will be apparent to those skilled in the art that various modifications and variations can be made in the organic light emitting display device of the present invention without departing from the spirit or scope of the invention. Thus, it is intended that the present invention cover the modifications and variations of this invention provided they come within the scope of the appended claims and their equivalents.

What is claimed is:
1. An apparatus, comprising:
a substrate including a plurality of pixels, each pixel including a light emitting area and a non-emitting area,
an auxiliary electrode in the non-emitting areas, the auxiliary electrode having a contact portion, the auxiliary electrode being in a same layer and comprising a same material as a source electrode or a drain electrode of a corresponding transistor in the emitting areas;
an overcoating layer directly on the auxiliary electrode, the source electrode, and the drain electrode; and
an organic light emitting structure, in the light emitting areas, having an organic layer sandwiched between a cathode and an anode, and at least a portion of the organic layer on the auxiliary electrode, the organic layer being directly on the overcoating layer,
wherein the contact portion of the auxiliary electrode is configured to electrically connect the auxiliary electrode with the cathode, and is configured to be at a particular distance away from the light emitting area.
2. The apparatus of claim 1, wherein the heat or energy is from laser welding used in connecting the auxiliary electrode with the cathode.
3. The apparatus of claim 2, wherein the particular distance is based upon characteristics of at least one among: a laser used in the laser welding, the substrate, the auxiliary electrode, and the organic light emitting structure.

4. The apparatus of claim 3, wherein the particular distance is that from a center of the contact portion of the auxiliary electrode to a terminal end of the anode.

5. A display device, comprising:
a substrate having a pixel, the pixel including an emitting area and a non-emitting area;
a thin film transistor, in the pixel on the substrate, including a gate electrode, a semiconductor layer, a source electrode, and a drain electrode;
an overcoating layer covering the thin film transistor;
a first electrode in the emitting area on the overcoating layer, the first electrode being connected to the thin film transistor;
a first auxiliary electrode in the non-emitting area, the first auxiliary electrode being disposed on the same layer as and formed of the same material as the first electrode, the first auxiliary electrode being directly on the overcoating layer;
an organic layer including an emission layer covering the first electrode and the first auxiliary electrode, the organic layer directly contacting the overcoating layer; and
a second electrode on the emission layer, the second electrode being in contact with the first auxiliary electrode through a contact portion,
wherein a distance from a center of the contact portion to a terminal end of the first electrode in the emitting area is 3 µm or more.

6. The display device of claim 5, further comprising a second auxiliary electrode in the non-emitting area, the second auxiliary electrode overlapping the first auxiliary electrode.

7. The display device of claim 6, wherein the second auxiliary electrode is in contact with the first auxiliary electrode.

8. The display device of claim 7, wherein the second auxiliary electrode is disposed on the same layer as the source electrode and the drain electrode.

9. The display device of claim 6, wherein the contact portion overlaps the second auxiliary electrode.

* * * * *